(12) United States Patent
Yoshimoto et al.

(10) Patent No.: US 7,966,897 B2
(45) Date of Patent: Jun. 28, 2011

(54) PLATING APPARATUS

(75) Inventors: Nobuhiko Yoshimoto, Tochigi (JP); Hitoshi Karasawa, Tochigi (JP); Koji Kobayashi, Tochigi (JP); Mizuho Doi, Tochigi (JP); Hitoshi Harata, Tochigi (JP)

(73) Assignee: Honda Motor Co., Ltd., Tokyo (JP)

( * ) Notice: Subject to any disclaimer, the term of this patent is extended or adjusted under 35 U.S.C. 154(b) by 109 days.

(21) Appl. No.: 12/441,189

(22) PCT Filed: Aug. 22, 2007

(86) PCT No.: PCT/JP2007/066252
§ 371 (c)(1),
(2), (4) Date: Mar. 13, 2009

(87) PCT Pub. No.: WO2008/047509
PCT Pub. Date: Apr. 24, 2008

(65) Prior Publication Data
US 2009/0229380 A1   Sep. 17, 2009

(30) Foreign Application Priority Data
Oct. 19, 2006   (JP) .................................. 2006-284520

(51) Int. Cl.
*G01L 3/10* (2006.01)
(52) U.S. Cl. ................................. 73/862.333
(58) Field of Classification Search ............. 73/862.331, 73/862.333, 862.335
See application file for complete search history.

(56) References Cited

U.S. PATENT DOCUMENTS

| | | | | |
|---|---|---|---|---|
| 6,001,235 A * | 12/1999 | Arken et al. | ................... | 205/137 |
| 6,793,794 B2 * | 9/2004 | Hongo et al. | .................... | 205/96 |
| 7,310,870 B2 * | 12/2007 | Shimizu et al. | ................. | 29/594 |
| 7,386,930 B2 * | 6/2008 | Shimizu et al. | ................. | 29/594 |
| 7,562,432 B2 * | 7/2009 | Harata et al. | .................... | 29/593 |
| 7,621,368 B2 * | 11/2009 | Shimizu et al. | ............... | 180/444 |
| 7,661,324 B2 * | 2/2010 | Harata et al. | ............. | 73/862.333 |
| 7,677,115 B2 * | 3/2010 | Fukuda et al. | ............. | 73/862.335 |
| 2004/0226384 A1 * | 11/2004 | Shimizu et al. | .................. | 73/762 |
| 2006/0081478 A1 * | 4/2006 | Sahoda et al. | ................ | 205/148 |
| 2006/0113185 A1 * | 6/2006 | Kuriyama et al. | .......... | 204/275.1 |
| 2007/0089287 A1 * | 4/2007 | Harata et al. | .................. | 29/602.1 |
| 2008/0257635 A1 * | 10/2008 | Shimizu et al. | ............... | 180/446 |

FOREIGN PATENT DOCUMENTS

| | | |
|---|---|---|
| JP | 62-120499 A | 6/1987 |
| JP | 4-37262 U | 3/1992 |
| JP | 2002-047595 A | 2/2002 |
| JP | 2004-238690 A | 8/2004 |
| JP | 2005-003622 A | 1/2005 |

* cited by examiner

*Primary Examiner* — Freddie Kirkland, III
(74) *Attorney, Agent, or Firm* — Arent Fox LLP (57) ABSTRACT

A plating apparatus includes a plating tank for storing a plating liquid, and applies a magnetic alloy plating to a shaft-shaped member immersed in the plating liquid by using the shaft-shaped member as a cathode. The plating apparatus further includes a rotable member configured to rotate the shaft-shaped member as a rotary shaft; annular shielding tools mounted on the outer peripheral surface of the shaft-shaped member; a plating liquid discharge nozzle including plating liquid discharge ports which are provided to face the shaft-shaped member so as to avoid the shielding tools; and an anode provided around the shaft-shaped member and the plating liquid discharge nozzle.

14 Claims, 5 Drawing Sheets

Figure 5:
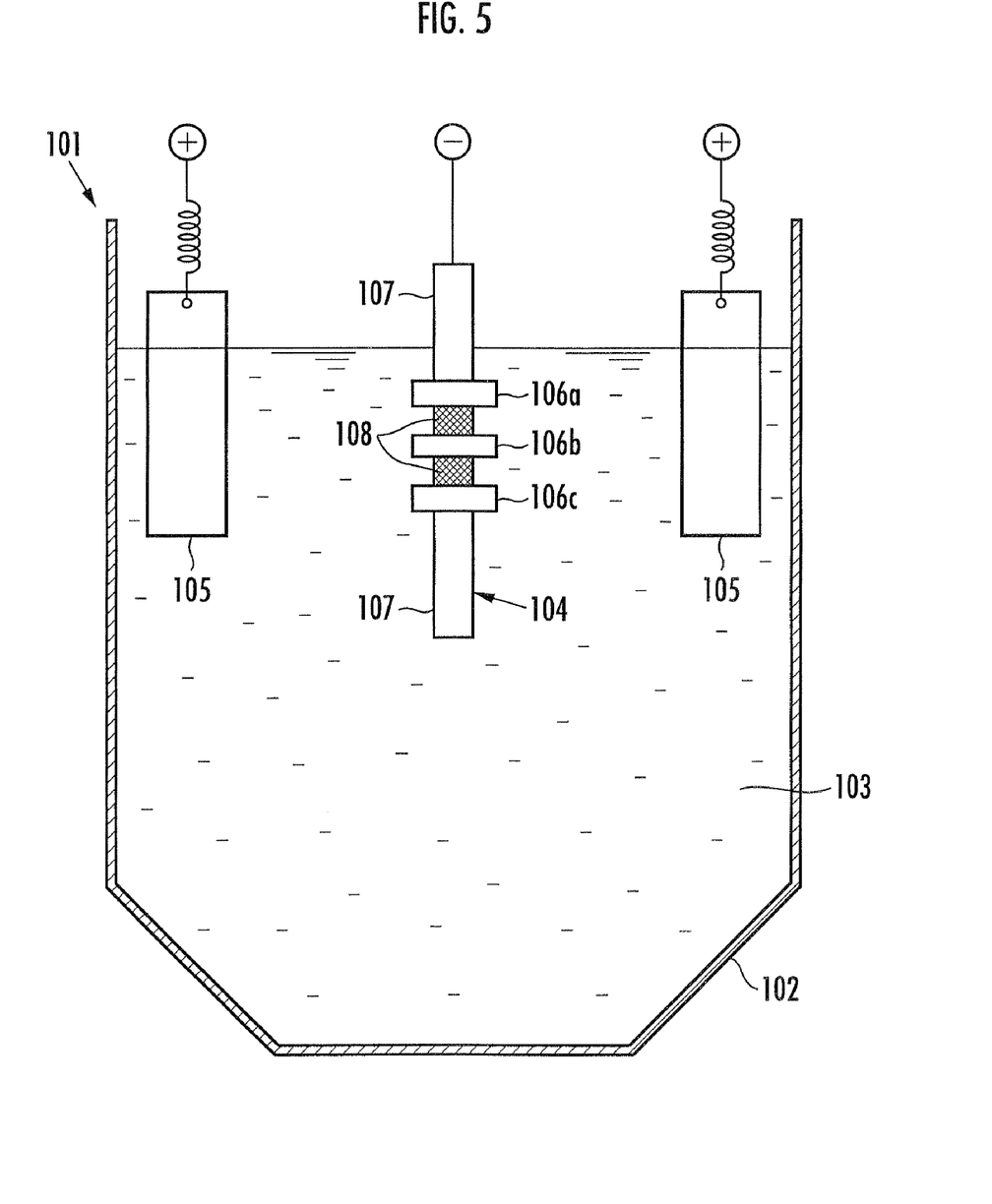
FIG. 5 is an illustration showing a prior art plating apparatus.

FIG. 5 ated by rotating the propeller so that the Ni ion concentration and the Fe ion concentration on the surface of the shaft-shaped member 104 are kept uniform. However, when the stirring intensity is low, only the plating liquid 103 near the bottom surface of the plating tank 102 is stirred, and the plating liquid 103 on the surface of the shaft-shaped member 104 is not sufficiently stirred. Thereby, the Ni-ion concentration and the Fe ion concentration in the plating liquid 103 on the surface of the shaft-shaped member 104 are made non-uniform on the upper and lower sides of the shaft-shaped member 104. This results in disadvantages that the Fe/Ni composition ratio in the magnetostrictive film 108 formed on the surface of the shaft-shaped member 104 is made non-uniform in the vertical direction of the magnetostrictive film 108, and that the thickness of the magnetostrictive film 108 is made non-uniform in the vertical direction of the magnetostrictive film 108. Further, since the plating liquid 103 is not sufficiently stirred, the Ni ion concentration and the Fe ion concentration in the plating liquid 103 are lowered on the surface of the shaft-shaped member 104. This results in a disadvantage that abnormal deposition is caused in the magnetostrictive film 108.

PLATING APPARATUS

TECHNICAL FIELD

The present invention relates to a plating apparatus.

BACKGROUND ART

A magnetostriction type torque sensor is widely known as an instrument for detecting torque applied to a rotary shaft. The magnetostriction type torque sensor is configured to have two upper and lower annular magnetostrictive films formed on the outer peripheral surface of the rotary shaft, and is configured to detect torque of the rotary shaft by detecting a change in the magnetostrictive characteristic of the upper and lower magnetostrictive films which change is caused when the rotary shaft is torsionally deformed. In order to secure the detection accuracy of torque, it is necessary that the axial-direction thickness of the magnetostrictive film is uniform, and that the alloy composition of the magnetostrictive film is uniform.

Conventionally, there is known a method shown in FIG. 5 as a method of applying plating to the surface of a shaft-shaped member used as a rotary shaft (Japanese Patent Laid-Open No. 2005-3622).

In a plating apparatus 101 disclosed in Patent Document 1, a shaft-shaped member 104 serving as a cathode and a Ni—Fe plate 105 serving as an anode are immersed in a plating liquid 103 stored in a plating tank 102.

Three cylindrical shielding tools 106a, 106b and 106c are mounted on the outer peripheral surface of the shaft-shaped member 104. Further, a masking tape 107 is wound around portions which are respectively located on the upper side of the upper end shielding tool 106a and on the lower side of the lower end shielding tool 106c, and in which the outer peripheral surface of the shaft-shaped member 104 is exposed.

Here, when a current is made to flow between the shaft-shaped member 104 and the Ni—Fe plate 105, Ni ions and Fe ions are dissolved into the plating liquid 103 from the Ni—Fe plate 105. By the Ni ions and Fe ions in the plating liquid 103, Ni—Fe-alloy plating 108 is applied to the portions of the shaft-shaped member 104 (hatched portions in the figure), which portions are not covered with the shielding tool 106 and the masking tape 107. Thereby, two magnetostrictive films 108 are formed on the upper and lower sides on the outer peripheral surface of the shaft-shaped member 104.

However, in the plating apparatus 101 as described in Patent Document 1, there is no liquid flow in the plating liquid 103 in the plating tank 102. Thus, the capacity for supplying the Ni ions and Fe ions dissolved in the plating liquid 103 to the shaft-shaped member 104 is reduced, and thereby a high current density cannot be maintained. This results in a disadvantage that the plating rate cannot be increased. Further, the Ni ion concentration and the Fe ion concentration in the plating liquid 103 are lowered on the surface not facing the Ni—Fe plate 105 of the shaft-shaped member 104. This results in a disadvantage that there occur abnormal deposition in which the composition, and the like, of the magnetostrictive film 108 is made non-uniform.

DISCLOSURE OF THE INVENTION

Problems to be Solved by the Invention

Thus, in order to eliminate the above described disadvantages, it is possible to increase the plating rate in such a manner that there is further provided a propeller (not shown) on the bottom surface of the plating tank 102, and that the plating liquid 103 is stirred by rotating the propeller so that the Ni ion concentration and the Fe ion concentration on the surface of the shaft-shaped member 104 are kept uniform. However, when the stirring intensity is low, only the plating liquid 103 near the bottom surface of the plating tank 102 is stirred, and the plating liquid 103 on the surface of the shaft-shaped member 104 is not sufficiently stirred. Thereby, the Ni-ion concentration and the Fe ion concentration in the plating liquid 103 on the surface of the shaft-shaped member 104 are made non-uniform on the upper and lower sides of the shaft-shaped member 104. This results in disadvantages that the Fe/Ni composition ratio in the magnetostrictive film 108 formed on the surface of the shaft-shaped member 104 is made non-uniform in the vertical direction of the magnetostrictive film 108, and that the thickness of the magnetostrictive film 108 is made non-uniform in the vertical direction of the magnetostrictive film 108. Further, since the plating liquid 103 is not sufficiently stirred, the Ni ion concentration and the Fe ion concentration in the plating liquid 103 are lowered on the surface of the shaft-shaped member 104. This results in a disadvantage that abnormal deposition is caused in the magnetostrictive film 108.

Thus, in order to eliminate the above described disadvantages, it is conceivable that the plating liquid 103 on the surface of the shaft-shaped member 104 is stirred by rotating the shaft-shaped member 104 instead of stirring the plating liquid 103 by rotating the propeller (not shown). However, when the shaft-shaped member 104 is rotated at a high speed, the plating liquid 103 is stirred not only by the shaft-shaped member 104 but also by the shielding tools 106. Thus, the stirring speed and the stirring direction of the plating liquid 103 on the surface of the shaft-shaped member 104 are different between the position close to the shielding tool 106 and the position away from the shielding tool 106. Thereby, the Ni ion concentration and the Fe ion concentration in the plating liquid 103 on the surface of the shaft-shaped member 104 are made non-uniform. This results in disadvantages that the Fe/Ni composition ratio in the magnetostrictive film 108 formed on the surface of the shaft-shaped member 104 is made non-uniform in the vertical direction of the magnetostrictive film 108, and that the thickness of the magnetostrictive film 108 is made non-uniform in the vertical direction of the magnetostrictive film 108.

Thus, it is conceivable that the plating liquid 103 is made to flow and stirred by making the plating liquid 103 flow upward from the bottom in parallel with the shaft direction of the shaft-shaped member 104 instead of stirring the plating liquid 103 by rotating the shaft-shaped member 104. However, since the shielding tools 106 are made to project in the radial direction from the shaft-shaped member 104, the flow of the plating liquid 103 is hindered by the shielding tools 106, and hence it is not possible to obtain a uniform liquid flow on the surface of the shaft-shaped member 104. Thereby, the Ni ion concentration and the Fe ion concentration in the plating liquid 103 on the surface of the shaft-shaped member 104 are made non-uniform. This results in disadvantages that the Fe/Ni composition ratio in the magnetostrictive film 108 formed on the surface of the shaft-shaped member 104 is made non-uniform in the vertical direction of the magnetostrictive film 108, and that the thickness of the magnetostrictive film 108 is made non-uniform in the vertical direction of the magnetostrictive film 108. Further, since the plating liquid 103 on the surface of the shaft-shaped member 104 is not sufficiently stirred, the Ni ion concentration and the Fe ion concentration in the plating liquid 103 on the surface of the shaft-shaped member 104 are lowered. This results in a disadvantage that abnormal deposition is caused in the magnetostrictive film 108.

An object of the present invention is to eliminate such disadvantages, and to provide a plating apparatus capable of applying magnetic alloy plating having a uniform thickness and composition to the surface of a shaft-shaped member at a high speed.

Means for Solving the Problems

In order to achieve the above described object, according to the present invention, there is provided a plating apparatus which includes a plating tank for storing a plating liquid and which applies magnetic alloy plating to a shaft-shaped member immersed in the plating liquid by using the shaft-shaped member as a cathode, the plating apparatus being characterized by including: rotating means configured to rotate the shaft-shaped member as a rotary shaft; an annular shielding tool mounted on the outer peripheral surface of the shaft-shaped member; a plating liquid discharge nozzle including a plating liquid discharge port which is provided to face the shaft-shaped member so as to avoid the shielding tool; and an anode provided around the shaft-shaped member and the plating liquid discharge nozzle.

In the plating apparatus according to the present invention, the plating liquid is stored in the plating tank, and the shaft-shaped member serving as a cathode and the anode are immersed in the plating liquid. When a current is applied between the shaft-shaped member and the anode, the surface of a to-be-plated portion of the shaft-shaped member, which surface is not covered by the shielding tool, is subjected to the magnetic alloy plating by the electrolytic reduction of the metal ions dissolved in the plating liquid.

At this time, the plating liquid is discharged toward the to-be-plated portion of the rotating shaft-shaped member from the plating liquid discharge port.

Thereby, the plating liquid is uniformly supplied to the whole surface of the to-be-plated portion, and a uniform flow of the plating liquid can be obtained over the whole surface of the to-be-plated portion. Further, since the shaft-shaped member is rotated, the plating liquid is supplied uniformly in the peripheral direction over the whole surface of the to-be-plated portion, and also the plating liquid is sufficiently stirred. Therefore, since the concentration of the respective metal ions in the plating liquid is kept constant over the whole surface of the to-be-plated portion, it is possible to form the magnetic alloy plating having a uniform composition and thickness on the surface of the shaft-shaped member in a short time. Also, it is possible to prevent the abnormal deposition from being caused.

Further, in the plating apparatus according to the present invention, it is preferred that a plurality of the plating liquid discharge ports are respectively arranged on at least two virtual straight lines located on the outer peripheral surface of the plating liquid discharge nozzle in parallel with the axial direction of the shaft-shaped member, and that the respective plating liquid discharge ports are arranged so that when the shaft-shaped member is rotated, the plating liquid discharged from the plating liquid discharge port arranged on the one virtual straight line and the plating liquid discharged from the plating liquid discharge port arranged on the other virtual straight line are overlapped with each other on the shaft-shaped member in the axial direction thereof. With this configuration, when the shaft-shaped member is rotated, the plating liquid discharged from the plating liquid discharge port arranged on the one virtual straight line and the plating liquid discharged from the plating liquid discharge port arranged on the other virtual straight line are overlapped with each other on the shaft-shaped member in the axial direction, so as to be supplied to the surface of the to-be-plated portion of the shaft-shaped member. Thereby, the plating liquid is uniformly supplied to the whole surface of the to-be-plated portion in the axial direction, and the concentration of the respective metal ions in the plating liquid can be kept constant over the whole surface of the to-be-plated portion. Thus, it is possible to make uniform the composition and thickness of the formed magnetic alloy plating as a whole.

Further, the plating apparatus according to the present invention may also be configured such that the shaft-shaped member is vertically immersed in the plating liquid, that a plurality of the plating liquid discharge ports are arranged on at least two virtual straight lines located on the outer peripheral surface of the plating liquid discharge nozzle in parallel with the axial direction of the shaft-shaped member, and that the upper end of the first plating liquid discharge port located on the one virtual straight line is positioned higher than the lower end of the second plating liquid discharge port located on the other virtual straight line adjacent to the one virtual straight line, and also the lower end of the first plating liquid discharge port is positioned lower than the upper end of the third plating liquid discharge port located immediately below the second plating liquid discharge port. With this configuration, the plating liquid discharged from the first plating liquid discharge port, the plating liquid discharged from the second plating liquid discharge port, and the plating liquid discharged from the third plating liquid discharge port are overlapped with each other in the axial direction, so as to be supplied to the surface of the to-be-plated portion of the rotating shaft-shaped member vertically immersed in the plating liquid. Thereby, the plating liquid is uniformly supplied to the whole surface of the to-be-plated portion in the axial direction, and the concentration of the respective metal ions in the plating liquid can be kept constant over the whole surface of the to-be-plated portion. As a result, it is possible to make uniform the composition and thickness of the formed magnetic alloy plating as a whole.

Further, in the plating apparatus according to the present invention, it is preferred that a plurality of the plating liquid discharge nozzles are provided around the shaft-shaped member. Thereby, the plating liquid is uniformly supplied to the whole surface of the to-be-plated portion in the axial direction, and the concentration of the respective metal ions in the plating liquid can be kept constant over the whole surface of the to-be-plated portion. As a result, it is possible to make uniform the composition and thickness of the formed magnetic alloy plating as a whole.

Meanwhile, the current has a feature that it tends to easily concentrate on a projecting section and an end section, and tends to hardly flow in a recessed section. Thus, when the diameter of the shielding tools provided at both ends is equal to the diameter of the shielding tool provided between the shielding tools at both ends, the current density on the surface of the to-be-plated portion of the shaft-shaped member is increased in the order of the to-be-plated portion away from the shielding tools at both ends and the shielding tool provided between the shielding tools at both ends, the to-be-plated portion near the shielding tool provided between the shielding tools at both ends, and the to-be-plated portion near the shielding tools at both ends. This may result in a case where the thickness of the formed magnetic alloy plating is not made uniform. Thus, in the plating apparatus according to the present invention, it is preferred that the shielding tool has a cylindrical shape and is attached in at least three places in the axial direction, and that the diameter of the shielding tools provided at both ends is different from the diameter of the shielding tool provided between the shielding tools at both ends so as to make uniform the current density distribution on the surface of the shaft-shaped member. Further, it is preferred that the shielding tool provided between the shielding tools at both ends is formed to have a diameter smaller than the diameter of the shielding tools at both ends. With this configuration, the current density distribution on the whole surface of the to-be-plated portion of the shaft-shaped member can be made uniform, and hence the thickness of the formed magnetic alloy plating can be made uniform as a whole.

In the plating apparatus according to the present invention, it is preferred that the shaft-shaped member is a steering shaft.

BEST MODE FOR CARRYING OUT THE INVENTION

Figure 1:
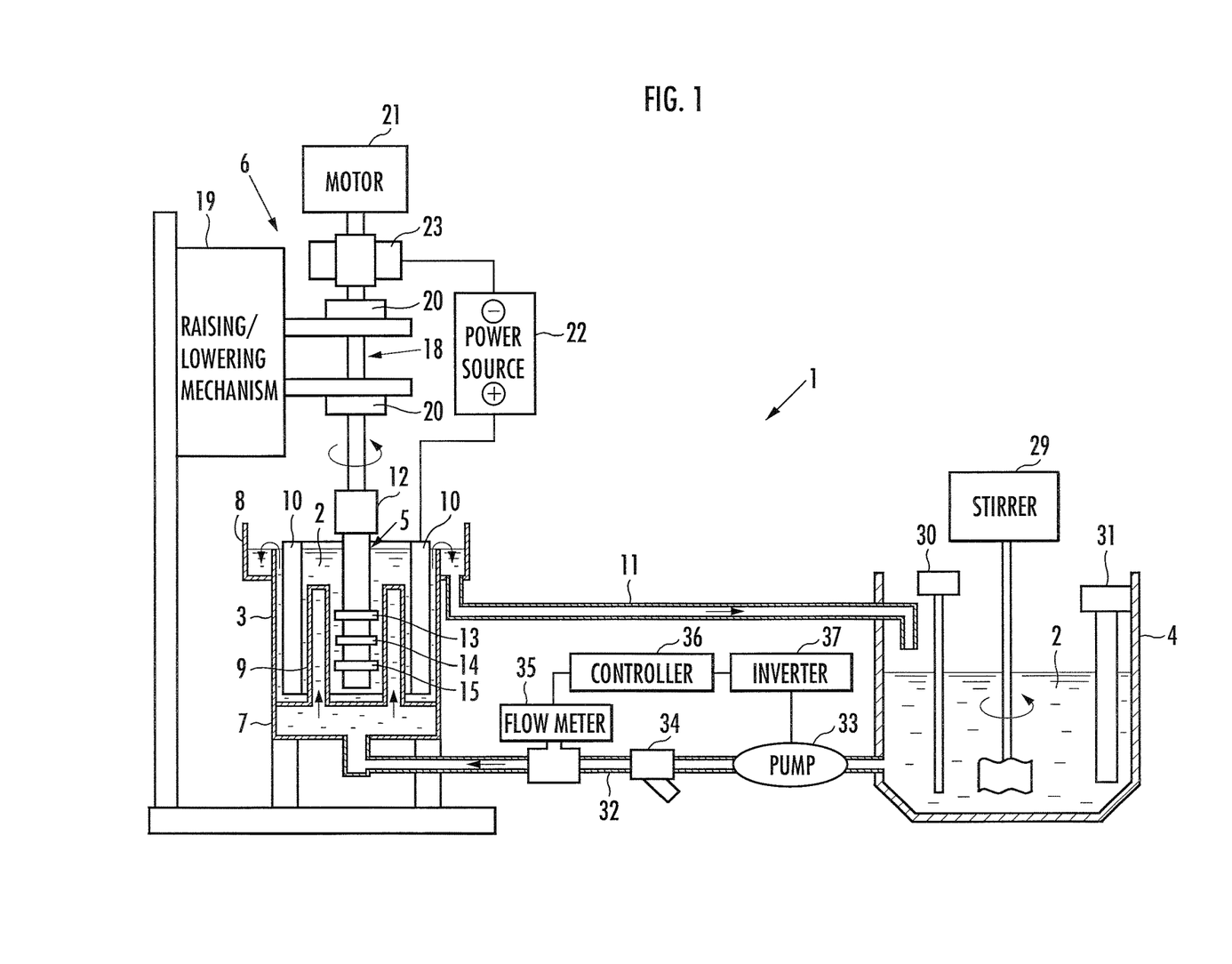
FIG. 1 is an explanatory front view showing a configuration example of a plating apparatus according to the present embodiment.

In the following, embodiments according to the present invention will be described in more detail with reference to the accompanying drawings. FIG. 1 is an explanatory front view showing a configuration example of a plating apparatus according to the present embodiment.

Figure 2:
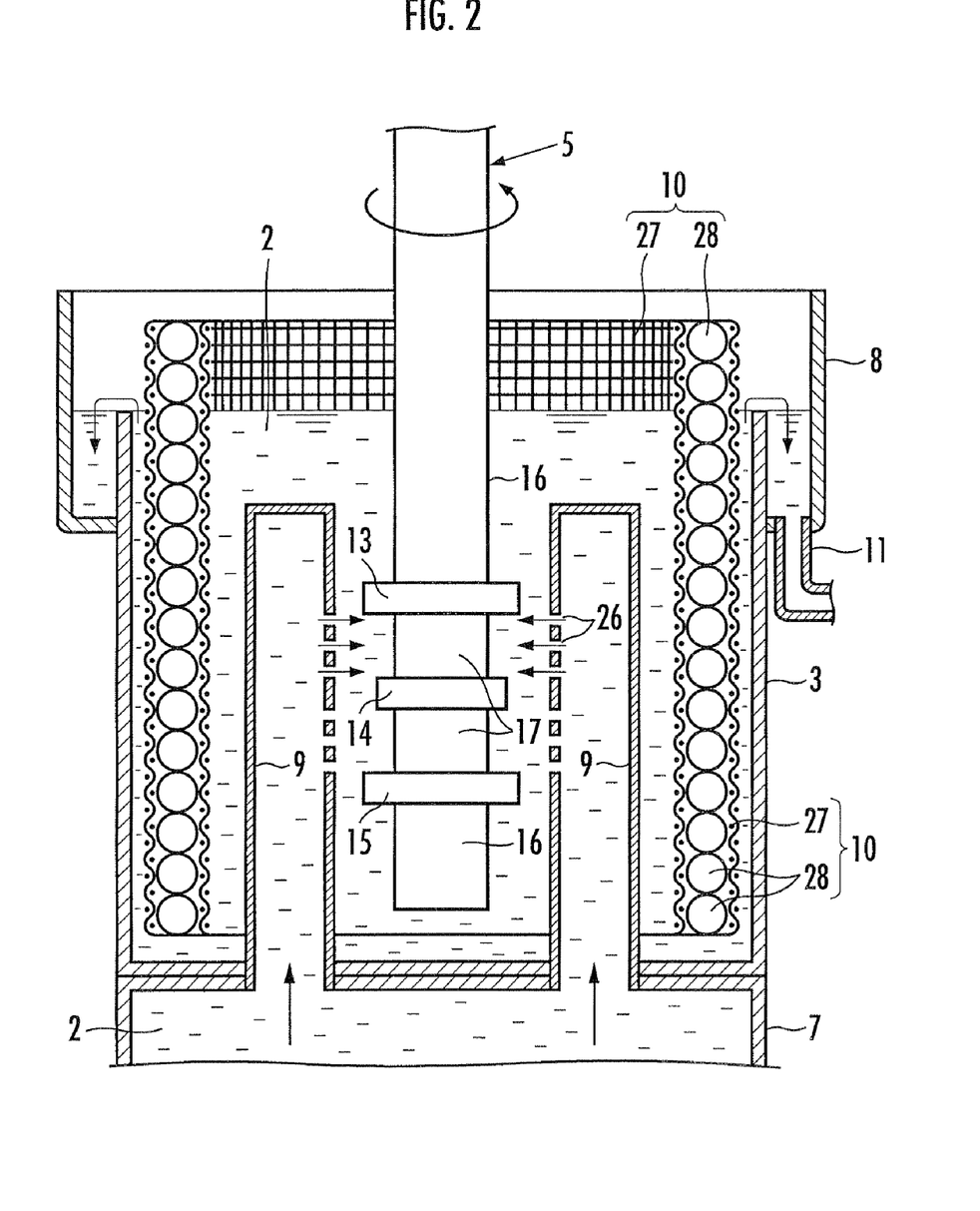
FIG. 2 is an explanatory sectional view showing an internal configuration of a plating tank of the plating apparatus according to the present embodiment shown in FIG. 1.
Figure 3:
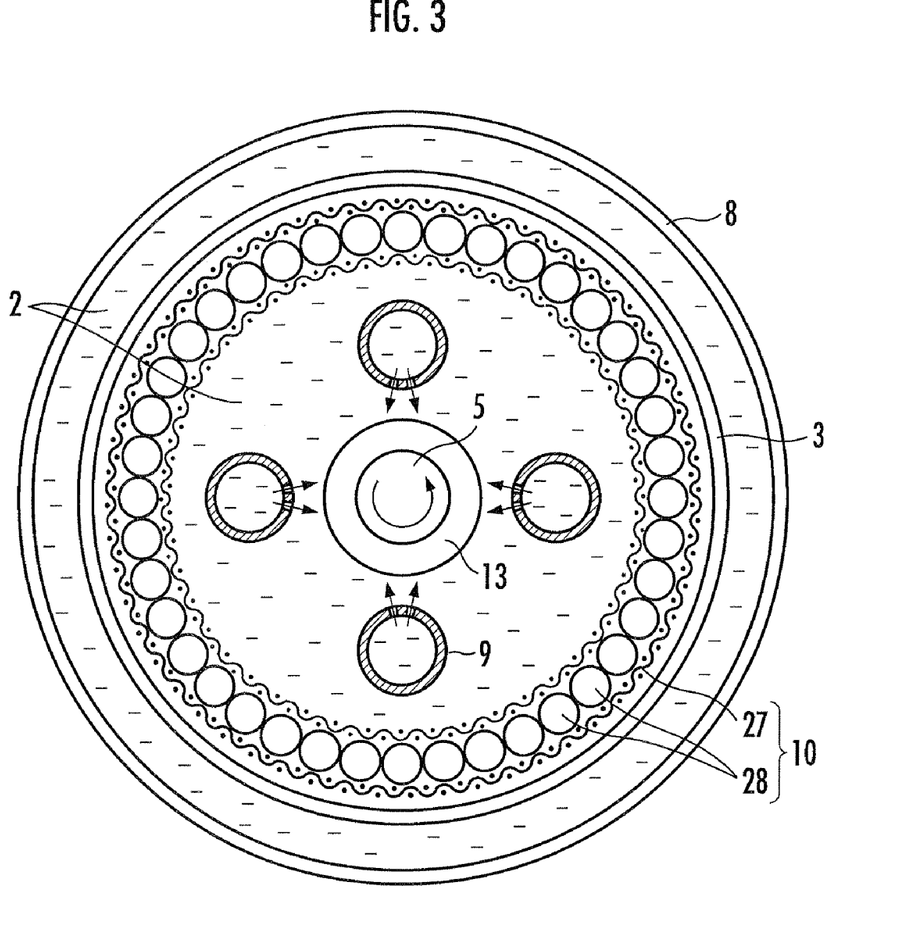
FIG. 3 is an explanatory plan view showing the internal configuration of the plating tank of the plating apparatus according to the present embodiment shown in FIG. 1.
Figure 4:
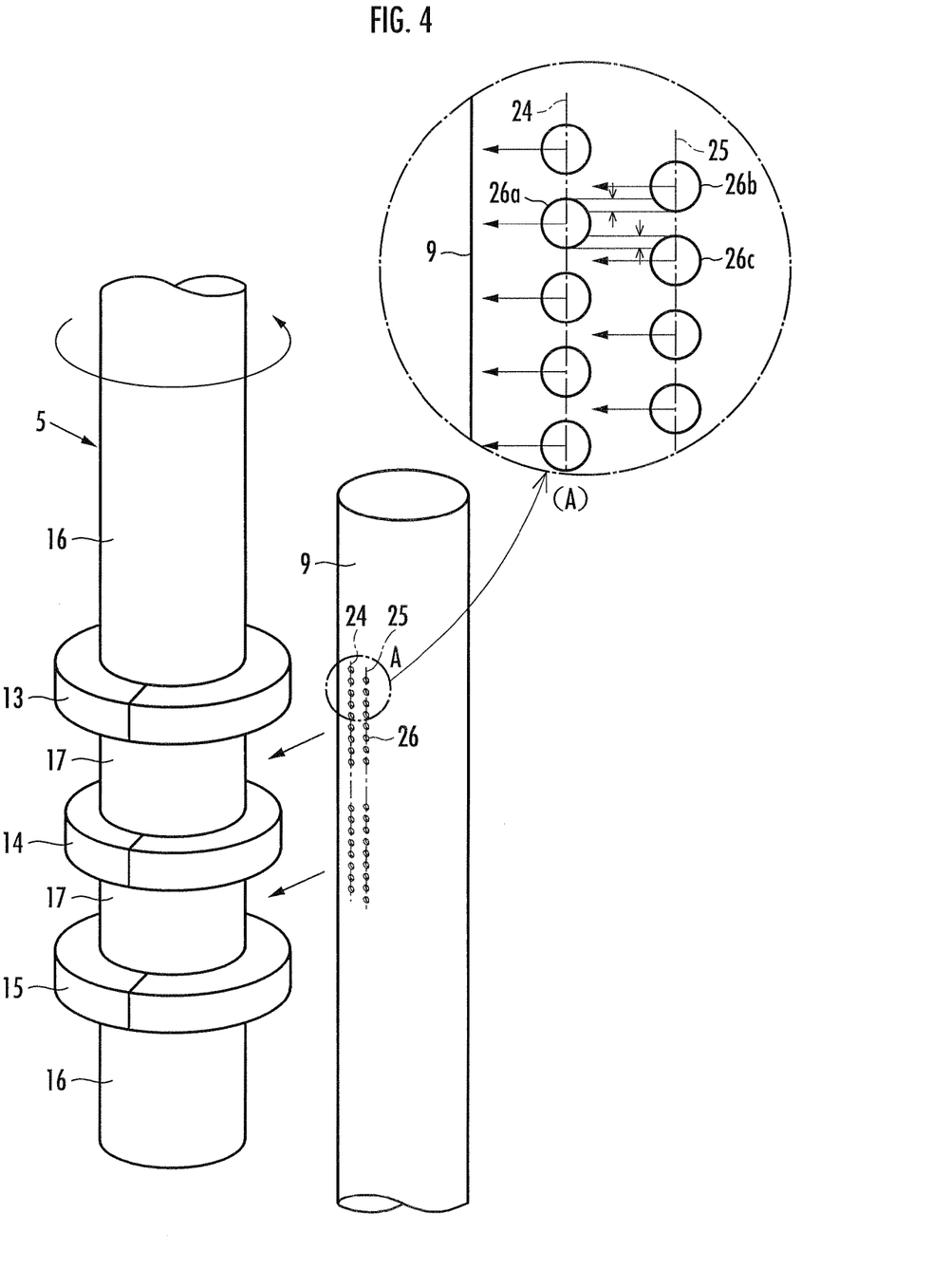
FIG. 4 is an explanatory perspective view showing a plating liquid discharge nozzle of the plating apparatus according to the present embodiment shown in FIG. 1.

FIG. 2 is an explanatory sectional view showing an internal configuration of a plating tank of the plating apparatus according to the present embodiment shown in FIG. 1. FIG. 3 is an explanatory plan view showing an internal configuration of the plating tank of the plating apparatus according to the present embodiment shown in FIG. 1. FIG. 4 is an explanatory perspective view showing a plating liquid discharge nozzle of the plating apparatus according to the present embodiment shown in FIG. 1. Note that in FIG. 4, the portion surrounded by the circle A is shown on an enlarged scale.

The plating apparatus 1 includes a plating tank 3 which stores a plating liquid 2, a plating liquid adjusting tank 4 for adjusting the temperature, and the like, of the plating liquid 2, and a rotation holding apparatus 6 for rotatably holding a shaft-shaped member 5 to be plated.

As shown in FIG. 2, the plating tank 3 is a cylindrical resin tank or a cylindrical metallic tank whose inner surface is coated with an insulation coating film. A liquid chamber 7 is provided on the lower outside of the plating tank 3. A recovering section 8 is provided on the upper outside of the plating tank 3. A plating liquid discharge nozzle 9 and an anode 10 are provided in the plating tank 3.

The plating tank 3 is configured such that the plating liquid 2 is supplied to the inside of the plating tank 3 from the inside of the liquid chamber 7 via the plating liquid discharge nozzle 9, and that the plating liquid 2 is made to overflow in the recovering section 8 from the upper end section of the plating tank 3, so as to be recovered in the plating liquid adjusting tank 4 via a plating liquid recovering pipe 11 which is provided at the bottom of the recovering section 8 so as to communicate with the plating liquid adjusting tank 4.

The plating liquid 2 is an alloy plating liquid containing at least Ni ions and Fe ions at a predetermined ratio, and is stored in the plating liquid adjusting tank 4 at a predetermined temperature. The shaft-shaped member 5 is immersed in the plating liquid 2 in the plating tank 3.

The shaft-shaped member 5 is a steering shaft made of, for example, a chromium-molybdenum steel material having a diameter of 20 mm, and is held at the center of the plating tank 3 in the vertical direction by a holding member 12 of the rotation holding apparatus 6 provided in the outside upper portion of the plating tank 3.

On the outer peripheral surface of the shaft-shaped member 5, there are mounted shielding tools 13, 14 and 15 made of, for example, a resin. The shielding tools 13, 14 and 15 are formed in a cylindrical shape having a length of 8 mm in the axial direction of the shaft-shaped member 5, and can be divided in the diameter direction so as to be able to be detached from the shaft-shaped member 5. The shielding tools 13 and 15 at both ends are set to have a diameter of 40 mm. On the other hand, the shielding tool 14 provided between the shielding tools 13 and 15 at both ends is formed to have a diameter of 34 mm which is smaller than the diameter of the shielding tools 13 and 15.

Further, a masking tape 16 is wound around the outer peripheral surface of the shaft-shaped member 5 at an upper portion than the upper end shielding tool 13 and at a lower portion than the lower end shielding tool 15. Therefore, to-be-plated sections 17 of the shaft-shaped member 5 are set as portions which are not covered by the shielding tools 13, 14 and 15, and by the masking tape 16.

The rotation holding apparatus 6 includes a metallic rotary shaft 18 provided in the vertical direction, a raising/lowering mechanism 19 provided in the intermediate section of the rotary shaft 18, bearings 20 provided at joining sections between the rotary shaft 18 and the raising/lowering mechanism 19, the holding member 12 provided at one end of the rotary shaft 18, a motor 21 provided at the other end of the rotary shaft 18, a power supply brush 23 which is provided near the motor 21 and which is electrically connected to a negative electrode of a power source 22. The rotation holding apparatus 6 is configured so as to immerse and pull up the shaft-shaped member 5 in and from the plating liquid 2 by making the rotary shaft 18 vertically moved by the raising/lowering mechanism 19. Further, the rotation holding apparatus 6 is configured so as to rotate the shaft-shaped member 5 by making the rotary shaft 18 rotated by the motor 21.

As shown in FIG. 3, four plating liquid discharge nozzles 9 are provided on the periphery of a circle centering around the shaft-shaped member 5. As shown in FIG. 4, each of the plating liquid discharge nozzles 9 includes a plurality of plating liquid discharge ports 26 at positions which are arranged on two virtual straight lines 24 and 25 located on the outer peripheral surface of the plating liquid discharge nozzles 9 in parallel with the axial direction of the shaft-shaped member 5, and which face the to-be-plated section 17 of the shaft-shaped member 5. The diameter of each of the plating liquid discharge ports 26 is set to 2 mm.

The upper end of a plating liquid discharge port 26a located on the virtual straight line 24 is provided at a position higher by 0.5 mm than the lower end of a plating liquid discharge port 26b located on the virtual straight line 25, and the lower end of the plating liquid discharge port 26a is provided at a position lower by 0.5 mm than the upper end of a plating liquid discharge port 26c located immediately below the plating liquid discharge port 26b. Further, the plating liquid discharge ports 26 other then the plating liquid discharge ports 26a, 26b and 26c are configured in the same manner.

The anode 10 is configured by a cylindrical metal basket 27 which has an open upper end and a closed lower end, and a plurality of metal pellets 28 stored in the metal basket 27. The metal basket 27 is arranged so as to surround, by the inner peripheral surface thereof, the plating liquid discharge nozzle 9, and is supported by a metal wire (not shown) having the surface coated with an insulation coating, so as not to be in contact with the inner peripheral surface and the bottom surface of the plating tank 3. The metal basket 27 is formed of a wire net made of a material, such as Ti, which is not dissolved into the plating liquid 2 when being energized, and is electrically connected to the positive electrode of the power source 22. On the other hand, the metal pellet 28 is made of a Ni—Fe alloy.

The plating liquid adjusting tank 4 includes a stirrer 29, a temperature regulator 30, and a heater 31, and stores the plating liquid 2 therein. The stirrer 29 stirs the plating liquid 2, so as to thereby allow the metal ions in the plating liquid 2 and the temperature of the plating liquid 2 to be uniformly distributed. The temperature regulator 30 controls the heater 31 by measuring the temperature of the plating liquid 2, so as to thereby maintain the temperature of the plating liquid 2 at a predetermined temperature.

The plating liquid 2 in the plating liquid adjusting tank 4 is supplied into the liquid chamber 7 via a plating liquid supply pipe 32 which makes the inside of the plating liquid adjusting tank 4 communicate with the inside of the liquid chamber 7. In the middle of the plating liquid supply pipe 32, there are provided a pump 33, a strainer 34, and a flow meter 35. Further, there is provided a controller 36 for adjusting the flow rate of the plating liquid 2, and the controller 36 is connected to the pump 33 via an inverter 37. The flow rate of the plating liquid 2 passing through the inside of the plating liquid supply pipe 32 is measured by the flow meter 35. The controller 36 compares the measured value with a preset value, and controls the inverter 37. The inverter 37 adjusts the pump flow rate of the pump 33, so that the flow rate of the plating liquid 2 supplied into the liquid chamber 7, that is, the flow rate of the plating liquid 2 discharged from the plating liquid discharge port 26 is adjusted. Further, foreign matters, such as dust, in the plating liquid 2 in the plating liquid supply pipe 32, are filtered by the strainer 34.

Note that in the present embodiment, the four plating liquid discharge nozzles 9 are assumed to be provided in the plating tank 3, but the number of the plating liquid discharge nozzles 9 may be a plural number other than four and may also be one.

Further, in the present embodiment, the metal pellet 28 is used as the anode 10. However, any shape, such as a spherical shape, may be used as the anode 10, as long as it has a size which can be stored in the metal basket 27 and which cannot pass through the mesh of the metal basket 27.

Further, in the present embodiment, the plating liquid which contains at least Ni ions and Fe ions at a predetermined ratio is used as the plating liquid 2, and a metal pellet made of a Ni—Fe alloy is used as the metal pellet 28. However, any plating liquid may be used as long as it contains Ni ions and Fe ions at a predetermined ratio. Also, a metal pellet made of a single metal of Ni, and a metal pellet made of a single metal of Fe may be used at a predetermined ratio. Further, the present embodiment may also be configured such that a plating liquid containing at least Fe ions is used as the plating liquid 2, and that a metal pellet made of a single metal of Ni is used as the metal pellet 28.

Next, there will be described an operation of the plating apparatus 1 according to the present embodiment configured as described above. First, a worker supplies the plating liquid 2 into the plating liquid adjusting tank 4, and turns on the stirrer 29, the temperature regulator 30, and the heater 31, to thereby set the plating liquid 2 in the plating liquid adjusting tank 4 at a predetermined temperature. At this time, Ni ions and Fe ions are dissolved in the plating liquid 2 in the plating liquid adjusting tank 4.

Next, when the worker turns on the pump 33, the plating liquid 2 in the plating liquid adjusting tank 4 is supplied into the plating liquid tank 3 via the plating liquid supply pipe 32, the chamber 7, and the plating liquid discharge nozzle 9. Also, the plating liquid 2 in the plating liquid tank 3 is made to overflow into the recovering section 8, so as to be recovered in the plating liquid adjusting tank 4 via the plating liquid recovering pipe 11. Thereby, the plating liquid 2 in the plating liquid adjusting tank 4 is circulated, so that the plating liquid 2 in the plating liquid tank 3 is set to the predetermined temperature.

Next, the worker lowers the shaft-shaped member 5 by operating the rotation holding apparatus 6, so as to make the shaft-shaped member 5 immersed in the plating liquid 2 in the plating liquid tank 3. Also, the worker makes the rotary shaft 18 rotated by the motor 21.

Next, the worker turns on the power source 22. Thereby, a current is made to flow from the metal basket 27 and the metal pellet 28 to the shaft-shaped member 5 in the plating liquid 2 in the plating tank 3, so that the Ni—Fe-alloy plating is applied to the to-be-plated section 17 of the shaft-shaped member 5 by the Ni ions and Fe ions in the plating liquid 2. Further, the Ni ions and the Fe ions are dissolved into the plating liquid 2 from the metal pellet 28 by the current.

Finally, the worker turns off the power source 22, and pulls up the shaft-shaped member 5 subjected to the Ni—Fe-alloy plating from the plating liquid 2 in the plating liquid tank 3 by operating the rotation holding apparatus 6.

In the present embodiment, when the power source 22 is turned on, the plating liquid 2 is discharged toward the to-be-plated section 17 of the rotating shaft-shaped member 5 from the plating liquid discharge port 26. Thereby, the plating liquid 2 is supplied to the whole surface of the to-be-plated section 17, and a uniform liquid flow can also be obtained over the whole surface of the to-be-plated section 17.

Further, the respective plating liquid discharge ports 26 are arranged in such a manner that the upper end of the plating liquid discharge port 26a on the virtual straight line 24 is located at a position higher than the lower end of the plating liquid discharge port 26b on virtual straight line 25, and that the lower end of the plating liquid discharge port 26a on the virtual straight line 24 is located at a position lower than the upper end of the plating liquid discharge port 26c located immediately below the plating liquid discharge port 26b. Further, the respective plating liquid discharge ports 26 are arranged in this way and the shaft-shaped member 5 is rotated, so that the plating liquid discharged from the plating liquid discharge port 26a and the plating liquid discharged from the plating liquid discharge ports 26b and 26c are supplied by being overlapped with each other on the surface of the to-be-plated section 17 of the shaft-shaped member 5 in the axial direction thereof. Thereby, the plating liquid 2 is uniformly supplied to the whole surface of the to-be-plated section 17 in the axial direction, so that the Ni-ion concentration and the Fe-ion concentration of the plating liquid 2 are kept constant over the whole surface of the to-be-plated section 17.

Further, since the shaft-shaped member 5 is rotated, the plating liquid 2 discharged from the plating liquid discharge port 26 is uniformly supplied to the whole surface of the to-be-plated section 17 in the peripheral direction thereof. Thereby, the Ni-ion concentration and the Fe-ion concentration in the plating liquid 2 are kept constant over the whole surface of the to-be-plated section 17.

As described above, the Ni-ion concentration and the Fe-ion concentration in the plating liquid 2 are kept constant over the whole surface of the to-be-plated section 17, and hence the Ni-ion concentration and the Fe-ion concentration in the plating liquid 2 on the surface of the to-be-plated section 17 are kept constant and prevented from being lowered. As a result, it is possible to maintain a high current density, and thereby the Ni—Fe-alloy plating can be applied at a higher speed as compared with the prior art plating apparatus 101.

Further, the plating liquid 2 is discharged from the plating liquid discharge port 26 to the to-be-plated section 17, and also the shaft-shaped member 5 is rotated. Thereby, the plating liquid 2 is fully stirred over the whole surface of the to-be-plated section 17. Therefore, the Ni-ion concentration and the Fe-ion concentration in the plating liquid 2 are not lowered over the whole surface of the to-be-plated section 17 as compared with the case where the plating liquid 2 is not stirred. Thereby, it is possible to prevent the abnormal deposition from being caused in the Ni—Fe-alloy plating.

Further, the shielding tool 14 provided between the shielding tools 13 and 15 at both ends is formed to have a diameter smaller than the diameter of the shielding tools 13 and 15, and thereby the current density distribution is made uniform over the whole surface of the to-be-plated section 17.

Therefore, with the plating apparatus 1 according to the present invention, it is possible to apply the Ni—Fe-alloy plating having a uniform thickness and composition to the surface of the shaft-shaped member 5 at a high speed.

Further, the plating apparatus 1 according to the present invention is configured such that the plating liquid 2 in the plating tank 3 is supplied from the plating liquid discharge nozzle 9 and is made to overflow into the recovering section 8 from the upper end section of the plating tank 3. As a result, the liquid level of the plating liquid 2 is maintained at a fixed level. Therefore, the current density on the surface of the to-be-plated section 17 is kept constant without being influenced by the change in the quantity of the plating liquid 2.

Further, the alloy plating liquid which contains at least Ni ions and Fe ions at a predetermined ratio is used as the plating liquid 2, and the metal pellet 28 containing Ni and Fe is used as the anode 10. Thus, even when the Ni ions and the Fe ions are consumed by performing the Ni—Fe-alloy plating, the Ni ions and the Fe ions are electrolytically dissolved into the plating liquid 2 from the metal pellet 28, so that the Ni-ion concentration and the Fe-ion concentration in the plating liquid 2 are kept constant. Thereby, it is possible to easily manage the plating liquid 2.

Further, it is configured such that the metal pellet 28 is stored in the metal basket 27. Thus, even in the middle of the plating, the metal pellet 28 can be easily supplied in the metal basket 27.

Further, the present embodiment is configured such that the Ni—Fe-alloy plating is applied to the shaft-shaped member 5. However, the present embodiment can also be configured such that Fe—Ni—Co alloy plating is applied to the shaft-shaped member 5. In this case, any plating liquid may be used as the plating liquid 2 as long as the plating liquid contains at least Ni ions, Fe ions, and Co ions at a predetermined ratio. Further, a metal pellet made of a Fe—Ni—Co alloy may be used as the metal pellet 28. Also, a metal pellet made of a single metal of Ni, a metal pellet made of a single metal of Fe, and a metal pellet made of a single metal of Co may also be used at a predetermined ratio. Further, it may also be configured such that a plating liquid containing at least Fe ions is used as the plating liquid 2, and that a metal pellet made of a single metal of Ni and a metal pellet made of a single metal of Co are used as the metal pellet 28 at a predetermined ratio. Further, the present embodiment can also be configured such that the Ni—Co alloy plating is applied to the shaft-shaped member 5. In this case, any plating liquid may be used as the plating liquid 2 as long as the plating liquid contains at least Ni ions and Co ions at a predetermined ratio. Further, a Ni—Co alloy may be used as the metal pellet 28. Also, a metal pellet made of a single metal of Ni and a metal pellet made of a single metal of Co may be used at a predetermined rate. Further, it may also be configured such that the plating liquid containing at least Ni ions is used as the plating liquid 2, and that a metal pellet made of a single metal of Co is used as the metal pellet 28.

DESCRIPTION OF SYMBOLS

1 . . . plating apparatus, 2 . . . plating liquid, 3 . . . plating tank, 5 . . . shaft-shaped member, 6 . . . rotating means, 9 . . . plating liquid discharge nozzle, 10 . . . anode, 13, 15 . . . shielding tools at both ends, 14 . . . shielding tools provided between shielding tools at both ends, 24 . . . one virtual straight line, 24 . . . other virtual straight line, 26 . . . plating liquid discharge port, 26a . . . first plating liquid discharge port, 26b . . . second plating liquid discharge port, 26c . . . third plating liquid discharge port.

The invention claimed is:

1. A plating apparatus which includes a plating tank for storing a plating liquid, and which applies magnetic alloy plating to a shaft-shaped member immersed in the plating liquid by using the shaft-shaped member as a cathode, the plating apparatus comprising:

rotating means configured to rotate the shaft-shaped member as a rotary shaft;

an annular shielding tool mounted on the outer peripheral surface of the shaft-shaped member;

a plating liquid discharge nozzle including a plating liquid discharge port which is arranged to face the shaft-shaped member so as to avoid the shielding tool mounted on the outer peripheral surface of the shaft-shaped member; and an anode provided around the shaft-shaped member and the plating liquid discharge nozzle.

2. The plating apparatus according to claim 1, wherein a plurality of the plating liquid discharge ports are respectively arranged on at least two virtual straight lines located on the outer peripheral surface of the plating liquid discharge nozzle in parallel with the axial direction of the shaft-shaped member, and wherein each of the plating liquid discharge ports is arranged so that when the shaft-shaped member is rotated, the plating liquid discharged from the plating liquid discharge port arranged on the one virtual straight line and the plating liquid discharged from the plating liquid discharge port arranged on the other virtual straight line are overlapped with each other on the shaft-shaped member in the axial direction.

3. The plating apparatus according to claim 1, wherein the shaft-shaped member is vertically immersed in the plating liquid, wherein a plurality of the plating liquid discharge ports are respectively arranged on at least two virtual straight lines located on the outer peripheral surface of the plating liquid discharge nozzle in parallel with the axial direction of the shaft-shaped member, and wherein the upper end of the first plating liquid discharge port located on the one virtual straight line is positioned higher than the lower end of the second plating liquid discharge port located on the other virtual straight line adjacent to the one virtual straight line, and also the lower end of the first plating liquid discharge port is positioned lower than the upper end of the third plating liquid discharge port located immediately below the second plating liquid discharge port.

4. The plating apparatus according to claim 1, wherein a plurality of the plating liquid discharge nozzles are provided around the shaft-shaped member.

5. The plating apparatus according to claim 4, wherein the shaft-shaped member is a steering shaft.

6. The plating apparatus according to claim 5, wherein the shielding tool has a cylindrical shape and is attached in at least three places in the axial direction of the shaft-shaped member, and wherein the diameter of the shielding tools at both ends is different from the diameter of the shielding tool provided between the shielding tools at both ends so that the current density distribution on the surface of the shaft-shaped member is made uniform.

7. The plating apparatus according to claim 6, wherein the shielding tool provided between the shielding tools at both ends is formed to have a diameter smaller than the diameter of the shielding tools at both ends.

8. The plating apparatus according to claim 4, wherein the shielding tool has a cylindrical shape and is attached in at least three places in the axial direction of the shaft-shaped member, and wherein the diameter of the shielding tools at both ends is different from the diameter of the shielding tool provided between the shielding tools at both ends so that the current density distribution on the surface of the shaft-shaped member is made uniform.

9. The plating apparatus according to claim 8, wherein the shielding tool provided between the shielding tools at both ends is formed to have a diameter smaller than the diameter of the shielding tools at both ends.

10. The plating apparatus according to claim 1, wherein the shaft-shaped member is a steering shaft.

11. The plating apparatus according to claim 10, wherein the shielding tool has a cylindrical shape and is attached in at least three places in the axial direction of the shaft-shaped member, and wherein the diameter of the shielding tools at both ends is different from the diameter of the shielding tool provided between the shielding tools at both ends so that the current density distribution on the surface of the shaft-shaped member is made uniform.

12. The plating apparatus according to claim 11, wherein the shielding tool provided between the shielding tools at both ends is formed to have a diameter smaller than the diameter of the shielding tools at both ends.

13. The plating apparatus according to claim 1, wherein the shielding tool has a cylindrical shape and is attached in at least three places in the axial direction of the shaft-shaped member, and wherein the diameter of the shielding tools at both ends is different from the diameter of the shielding tool provided between the shielding tools at both ends so that the current density distribution on the surface of the shaft-shaped member is made uniform.

14. The plating apparatus according to claim 13, wherein the shielding tool provided between the shielding tools at both ends is formed to have a diameter smaller than the diameter of the shielding tools at both ends.

* * * * *